(12) United States Patent
Kluser et al.

(10) Patent No.: US 7,240,976 B2
(45) Date of Patent: Jul. 10, 2007

(54) MODULAR RACK-MOUNTING SYSTEM

(75) Inventors: Robert D. Kluser, Aloha, OR (US); Warren L. Powers, Woodburn, OR (US)

(73) Assignee: Tektronix, Inc., Beaverton, OR (US)

( * ) Notice: Subject to any disclaimer, the term of this patent is extended or adjusted under 35 U.S.C. 154(b) by 1138 days.

(21) Appl. No.: 09/841,402

(22) Filed: Apr. 23, 2001

(65) Prior Publication Data

US 2002/0153811 A1    Oct. 24, 2002

(51) Int. Cl.
    *G06F 1/16*    (2006.01)

(52) U.S. Cl. .................... 312/223.2; 312/333

(58) Field of Classification Search .............. 312/223.1, 312/223.2, 333, 265; 361/683, 684, 685, 361/686, 724, 725, 726, 727; 211/26; 220/4.24, 220/4.02
See application file for complete search history.

(56) References Cited

U.S. PATENT DOCUMENTS

| | | | | |
|---|---|---|---|---|
| 3,482,895 A | * | 12/1969 | Becklin | ........................ 312/352 |
| 3,547,274 A | * | 12/1970 | Sosinski | ........................ 211/26 |
| 4,232,356 A | * | 11/1980 | Saunders et al. | ...... 174/DIG. 9 |
| 4,384,368 A | * | 5/1983 | Rosenfeldt et al. | .......... 398/140 |
| 4,479,263 A | * | 10/1984 | Rosenfeldt et al. | .......... 312/7.1 |
| 4,496,057 A | | 1/1985 | Zenitani | |
| 4,688,131 A | * | 8/1987 | Noda et al. | ................... 360/137 |
| 5,138,525 A | * | 8/1992 | Rodriguez | ................... 361/683 |
| 5,235,493 A | * | 8/1993 | Yu | ............................... 361/685 |
| 5,305,187 A | | 4/1994 | Umezu | |
| 5,404,275 A | | 4/1995 | Zenitani | |
| 5,481,429 A | * | 1/1996 | Eriksson et al. | ............. 361/678 |
| 5,503,472 A | * | 4/1996 | Vu et al. | ................... 312/223.2 |
| 5,587,877 A | * | 12/1996 | Ryan et al. | ................... 361/683 |
| 5,682,291 A | * | 10/1997 | Jeffries et al. | ............ 312/223.2 |
| 5,687,063 A | | 11/1997 | Chabert | |
| 5,768,097 A | * | 6/1998 | Jelinger | ........................ 361/683 |
| 6,061,244 A | | 5/2000 | O'Sullivan | |
| 6,109,329 A | * | 8/2000 | Russo | .......................... 160/135 |
| 6,181,549 B1 | | 1/2001 | Mills et al. | |
| 6,373,707 B1 | | 4/2002 | Hutchins | |
| 6,469,899 B2 | | 10/2002 | Hastings et al. | |

FOREIGN PATENT DOCUMENTS

| | | |
|---|---|---|
| FR | 2735946 A1 | 12/1996 |
| GB | 2119579 | 2/1983 |
| JP | 60-82795 | 6/1985 |
| JP | 3050721 | 5/1998 |

* cited by examiner

*Primary Examiner*—Janet M. Wilkens
(74) *Attorney, Agent, or Firm*—Francis I. Gray; Matthew D. Rabdau

(57) ABSTRACT

A modular rack-mounting system has a rigid, lightweight frame forming a central compartment within which a sleeve is configured to fit, the sleeve having a ventilation configuration to conform with the cooling requirements of an instrument to be inserted within the sleeve. A flat, steel spring is mounted on the side of the frame so that a button extends through a hole in the side to engage a corresponding hole in the side of the sleeve when the sleeve is inserted into the compartment. For a half-rack mount a central rib is included in the frame to divide the central compartment into two compartments, the sleeve being configured to fit into either of the two compartments. Buttons on steel springs are mounted on opposing sides of the central rib to engage the corresponding holes in the sleeves when the sleeve is inserted into either compartment. To release and exchange the sleeves, the buttons at the interior of the sleeves are pushed to allow the sleeves to be removed.

7 Claims, 5 Drawing Sheets

MODULAR RACK-MOUNTING SYSTEM

BACKGROUND OF THE INVENTION

The present invention relates to rack-mounting systems, and more particularly to a modular rack-mounting system that is flexible for mounting instruments having different environmental requirements.

In many instrumentation environments a plurality of instruments are mounted in large racks. In order to mount the instruments in the rack, standard sizes have been implemented regarding width and height for each rack unit. As a result the instruments are sized to fit either into a full rack mount or into a half rack mount. In the case of half rack mounts, a full rack mount is generally provided with sleeves that separate the full rack mount into half rack mounts. A typical half rack-mounting system is shown in FIG. 1 where a current fixed rack-mounting system is shown having a pair of half rack sleeves welded together with a pair of bands welded around the front and back edges to provide structural stability. The sleeves have ventilation holes in them in a particular configuration to allow cooling air to circulate around the instrument according to the instrument's requirements when mounted in the rack. As long as all instruments have the same requirements for air circulation, for example, this fixed rack-mounting system is adequate. But as new instruments are developed, different air circulation requirements arise requiring different sleeve configurations.

To provide for all the different sleeve ventilation configurations to enable a user to mount instruments on the rack in any desired configuration requires an innumerable number of different rack-mounting systems.

Therefore what is desired is a flexible modular rack-mounting system that allows for the exchange of different sleeve configurations while maintaining a single rack-mounting system.

BRIEF SUMMARY OF THE INVENTION

Accordingly the present invention provides a flexible modular rack-mounting system that has a rigid rack frame having a top, bottom and two sides defining a central compartment, a central rib attached between the top and bottom of the frame to divide the central compartment into two compartments, and a sleeve that slides into either compartment defined by the rack frame and central rib. A hole is provided at a point along each side of the sleeve such that, when the sleeve is slid into the rack frame, a button mounted on a flat spring attached to the frame sides and/or the central rib engages the hole to hold the sleeve securely in place. To remove or replace the sleeve, the button is depressed from the interior of the sleeve and the sleeve is slid out.

The objects, advantages and other novel features of the present invention are apparent from the following detailed description when read in conjunction with the appended claims and attached drawing.

DETAILED DESCRIPTION OF THE INVENTION

Figure 1:
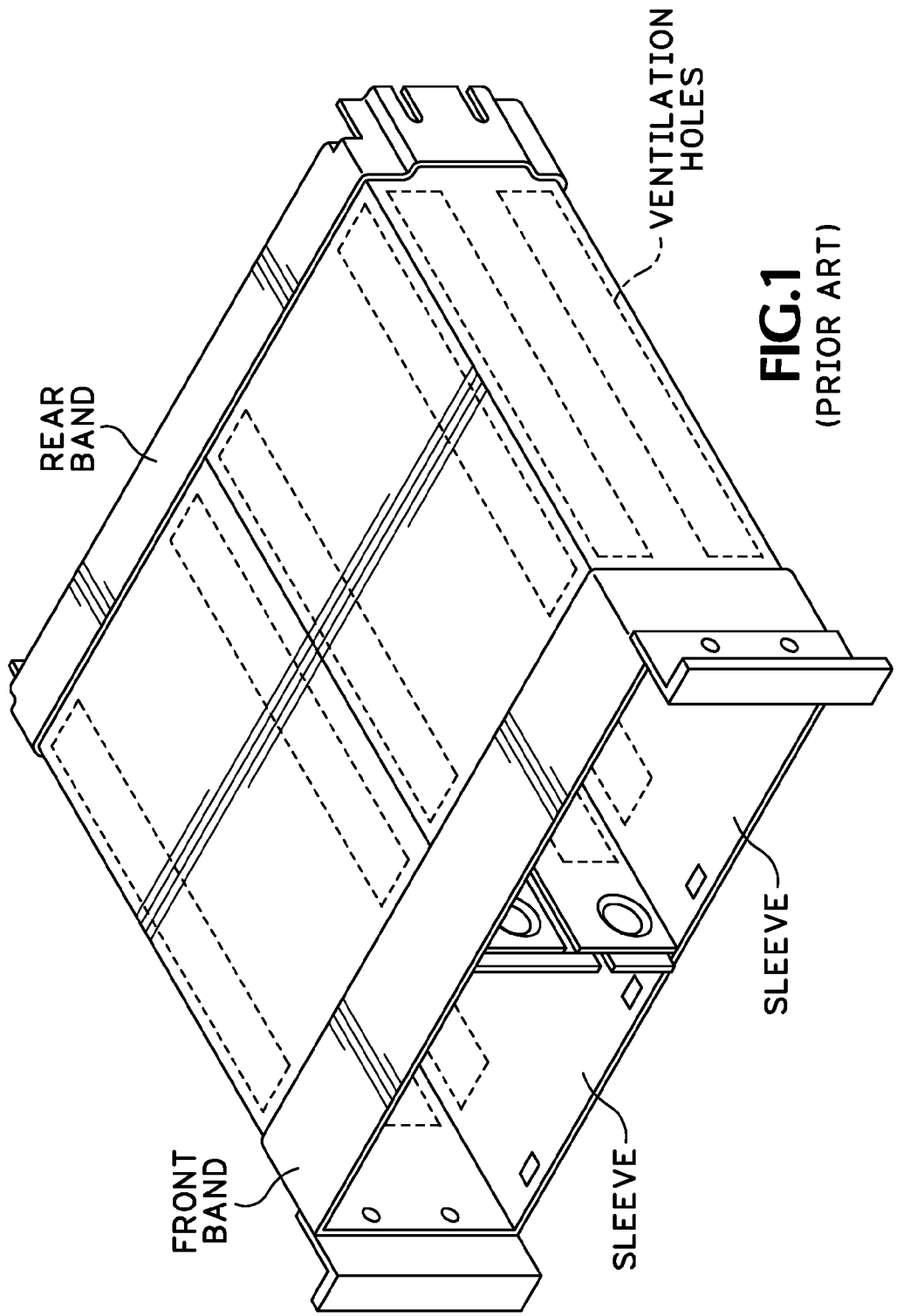
FIG. 1 is a perspective view of a prior art rack-mounting system.
Figure 2:
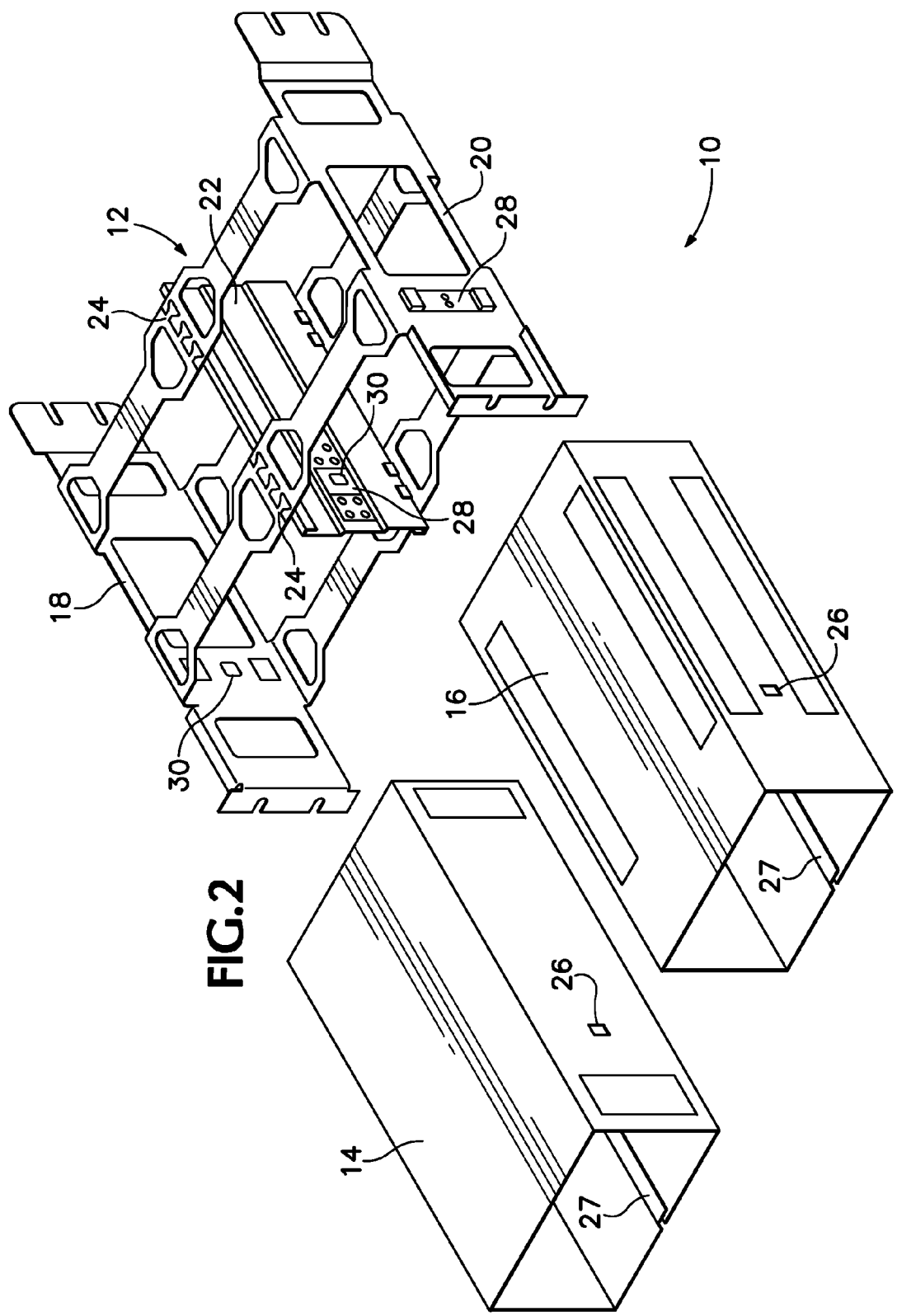
FIG. 2 is an exploded perspective view of a modular rack-mounting system according to the current invention.

Referring now to FIG. 2 a modular rack-mounting system 10 is shown having a frame 12 and a pair of interchangeable sleeves 14, 16. The frame 12 has a left and a right portion 18, 20 and a central rib 22, dividing the interior of the frame into two compartments. The left and right portions 18, 20 may have interlocking fingers 24 that are press fitted together and then optionally spot welded to assure rigidity of the frame 12 and provide a smooth surface. The central rib 22 is affixed to the left and right portions 18, 20 by any suitable means, such as rivets, screws, spot welding or the like. Each sleeve 14, 16 has a hole 26 in each side. The holes 26 engage snap and latch systems 28 attached to the sides of the left and right portions 18, 20 and both sides of the central rib 22. To secure the sleeves 14, 16 in the frame 12, the sleeves are slid into the respective compartments in the frame 12 formed by the sides of the frame and the central rib 22 until the holes 26 engage the snap and latch systems 28. To remove and exchange sleeves 14, 16, a button 30 that is part of the snap and latch system 28 and extends into the holes 26 is depressed from the interior of the sleeves to release them and allow them to be slid out of the frame 12. In this manner any sleeve configuration may be placed in either half rack compartment formed by the frame 12 and central rib 22 in order to accommodate the environmental requirements of different instruments.

The sleeves 14,16 may be formed from sheet metal material that is punched and folded appropriately. The joint 27 where the folded ends meet to complete the sleeve 14, 16 may be overlapped and welded as shown in FIG. 2, or may have interlocking "fingers" that are press fitted together and optionally spot welded as described above with respect to the frame 12.

Figure 3:
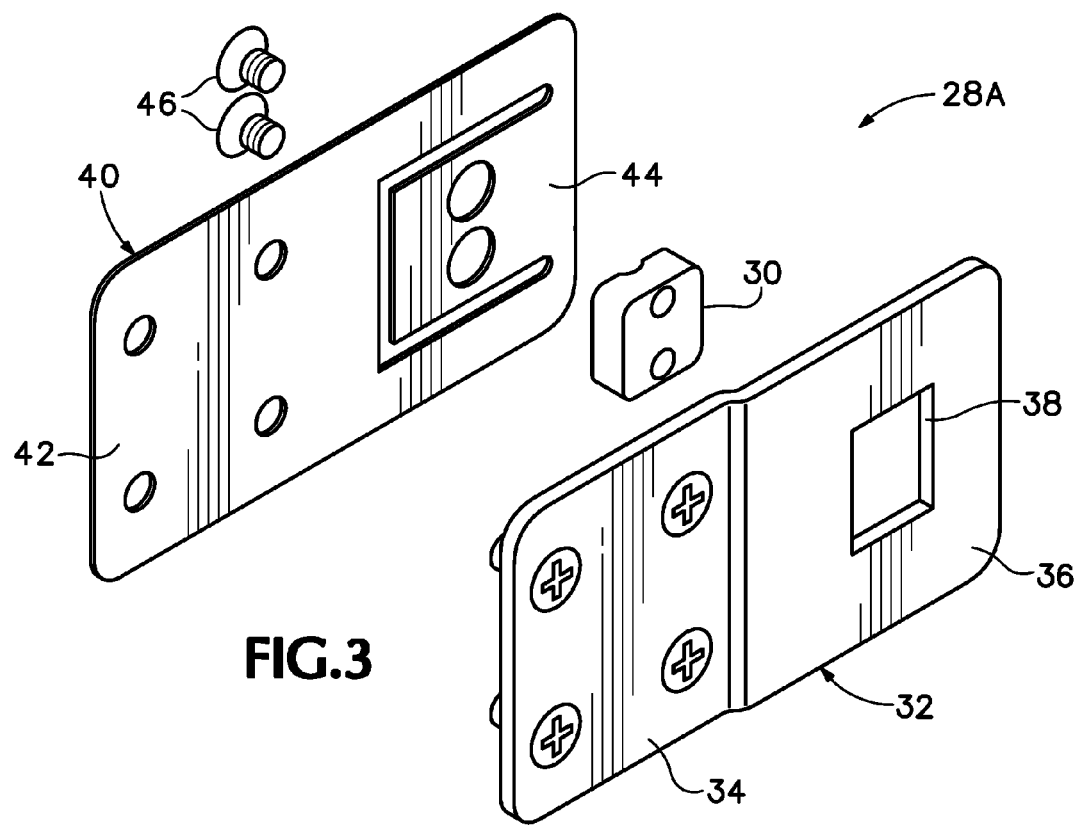
FIG. 3 is an exploded perspective view of a first embodiment of a snap and latch system for the modular rack-mounting system according to the present invention.
Figure 4:
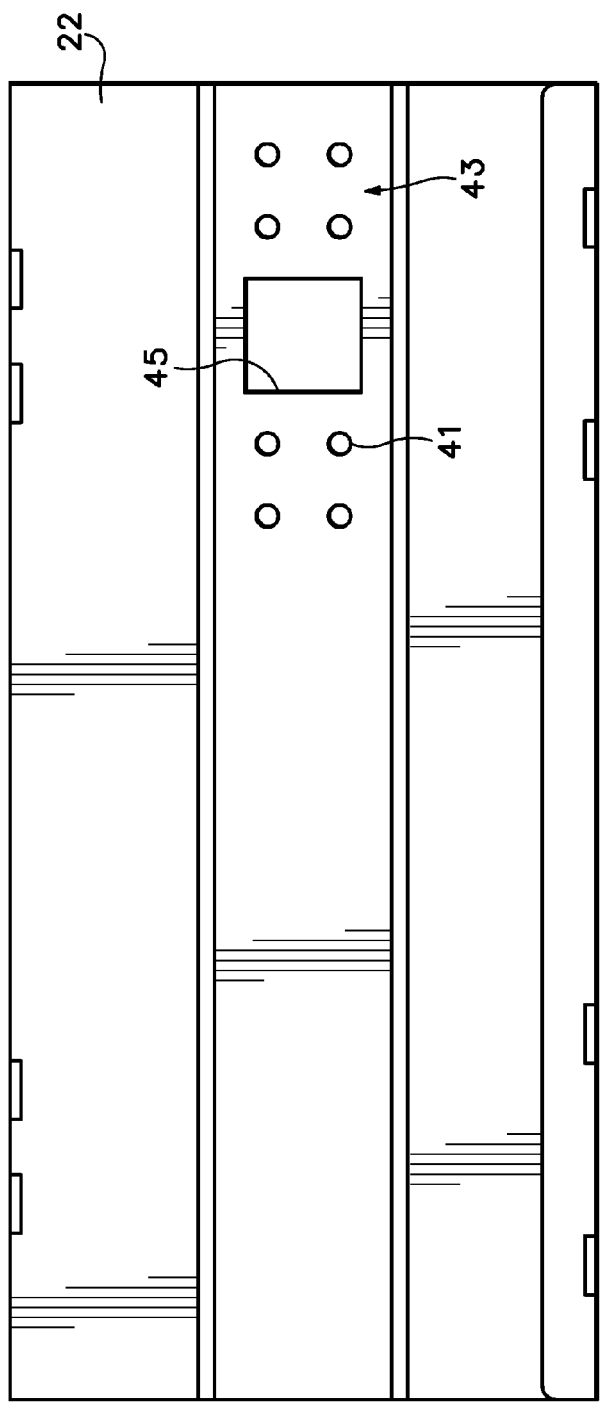
FIG. 4 is a side plan view of a central rib for the modular rack-mounting system according to the present invention.
Figure 5:
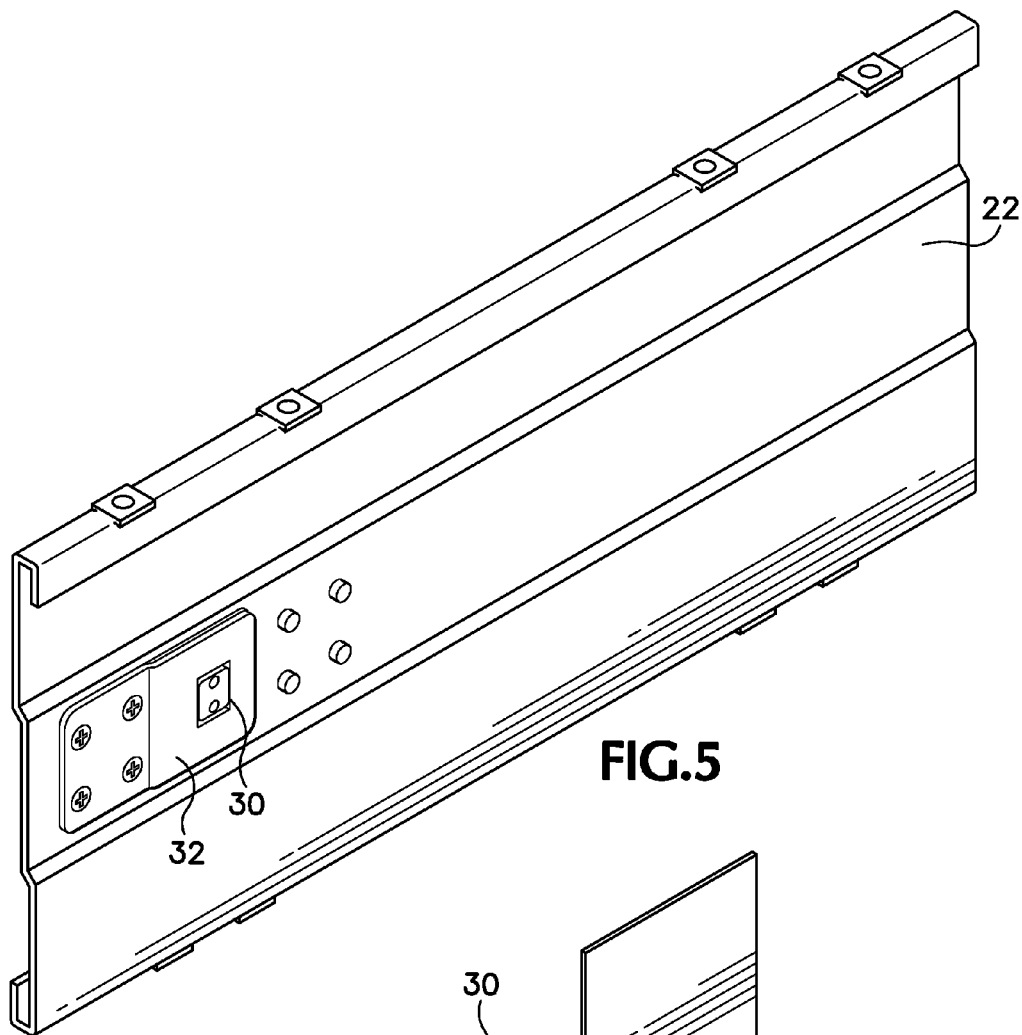
FIG. 5 is a perspective view of the central rib of FIG. 4 with the snap and latch system of FIG. 3 mounted thereon according to the present invention.

As shown in FIG. 3 a first snap and latch system 28A that is mounted on the central rib 22 has a support plate 32 having a mounting section 34 and an offset section 36 with a central hole 38. A spring plate 40 has a support end 42 and a spring end 44. Mounted on the spring end 44 is the button 30 using any suitable means 46, such as screws, rivets or the like. The button 30 is mounted so that when the spring plate 40 is mounted between central rib 22 and the support plate 32 it protrudes through the central hole 38 of the offset section 36. The button 30 has a small radius around the periphery of the protruding head, and the sleeves 14, 16 also have a slight radius along their edges. Referring further to FIG. 4 the central rib 22 has a pair of mounting locations 41, 43 on either side of a through hole 45. When mounted in opposing manner on opposite sides of the central rib 22, as shown in FIG. 5, the spring ends 44 of the spring plates 40 are located so that, when the button 30 is depressed, the spring end may deform into the through hole 45 to allow the button to clear the hole 26 in the sleeve 14, 16.

Figure 7:
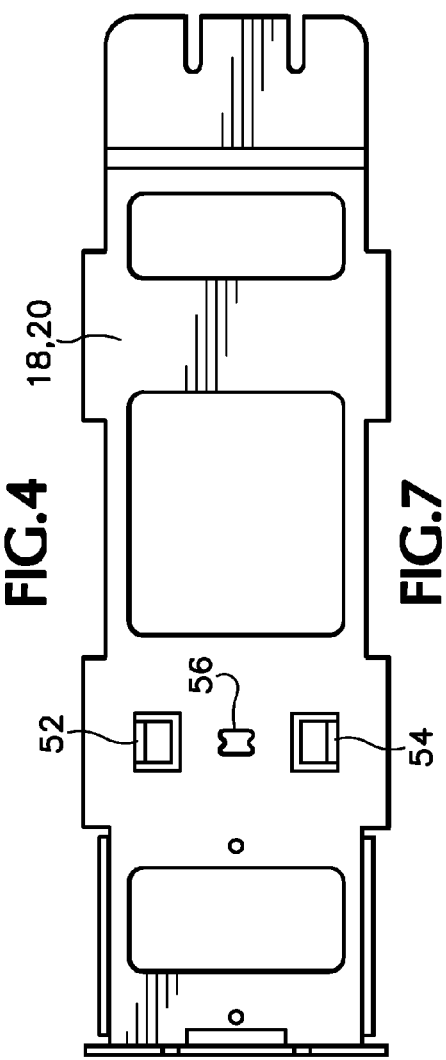
FIG. 7 is a side plan view of a frame portion of a modular rack-mounting system according to the present invention.
Figure 6:
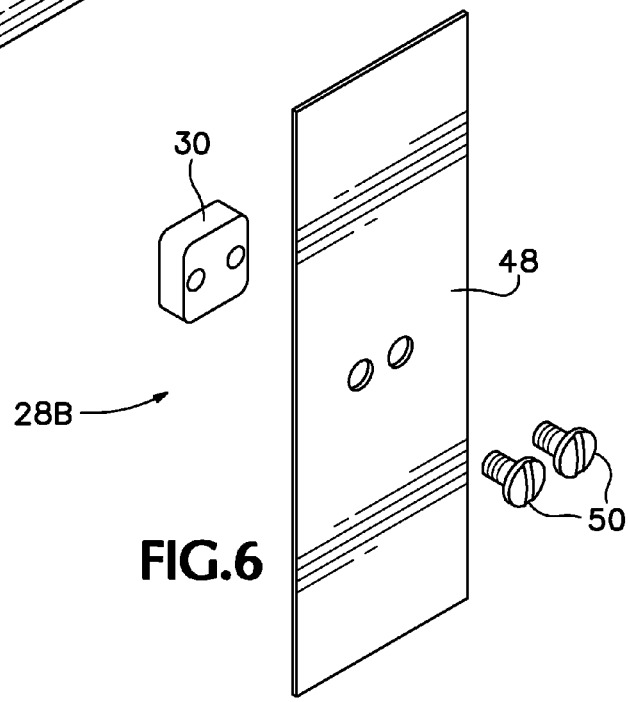
FIG. 6 is an exploded perspective view of a second embodiment of a snap and latch system for the modular rack-mounting system according to the present invention.

A simpler snap and latch system 28B may be mounted on the frame 12 itself, as shown in FIG. 6. A spring steel ribbon 48 has the button 30 mounted on it by suitable means 50. The side of each frame portion 18, 20, as shown in FIG. 7, has a pair of opposing flanges 52, 54 on the exterior flanking a hole 56. The spring steel ribbon 48 is secured between the flanges 52, 54 on the exterior of the frame portion 18, 20 so that the button 30 extends through the hole 56.

Although what is described above is a half-rack mounting system, where the frame 12 and central rib 22 form two compartments, the central rib may be removed to form a single compartment for a full-rack mounting system. For the full-rack mounting system the sleeves 14, 16 are sized accordingly, and only the simpler snap and latch system 28B of FIG. 6 mounted on the frame 12 is used to secure the sleeves in the frame.

Thus the present invention provides a modular rack-mounting system that is flexible enough to accommodate different sleeves according to environmental requirements of instruments to be mounted therein, the system having a rigid frame with a central rib and snap and latch systems mounted on the rib and frame so that the sleeves are retained in the frame when inserted into the frame, yet are releasable so they may be exchanged according to instrument requirements.

What is claimed is:

1. A modular rack-mounting system comprising:
   a frame suitable for mounting on an instrument rack, the frame forming a central compartment having a top, a bottom and two sides;
   a sleeve within which an instrument may be mounted, the sleeve being configured to be inserted and fit within the central compartment; and
   means for detachably securing the sleeve within the central compartment.

2. The modular rack-mounting system as recited in claim 1 wherein the securing means comprises:
   a spring mounted on the frame;
   a button mounted on the spring and extending through a hole in the frame into the central compartment to engage a corresponding hole in the sleeve when the sleeve is inserted within the central compartment, the button being accessible from the interior of the sleeve so that, when the button is depressed from the interior of the sleeve, the sleeve may be readily removed from the central compartment.

3. The modular rack-mounting system as recited in claim 1 wherein the frame comprises:
   a left portion having fingers; and
   a right portion having fingers, the fingers of the left and right portions interlocking with each other to assure rigidity of the frame.

4. The modular rack-mounting system as recited in claim 1 further comprising a central rib mounted within the frame to form a central wall that divides the central compartment into two equal compartments, the sleeve being configured to fit within either compartment.

5. The modular rack-mounting system as recited in claim 4 wherein the securing means comprises:
   an inner spring mounted on the central rib;
   a button mounted on the inner spring to engage a hole in the sleeve when the sleeve is inserted into one of the two compartments, the button being accessible from the interior of the sleeve so that, when the button is depressed from the interior of the sleeve, the sleeve may be readily removed from the one compartment.

6. The modular rack-mounting system as recited in claim 4 wherein the securing means comprises:
   a first inner spring mounted on a first side of the central rib having a first button mounted on one end; and
   a second inner spring mounted on a second side of the central rib in an opposing manner to the first inner spring and having a second button mounted on one end, the first and second buttons being mounted to engage corresponding holes in respective sleeves when the respective sleeves are inserted into the two compartments, the central rib having a rib hole between the button ends of the first and second inner springs to allow the button ends to deform into the rib hole when the buttons are depressed for removing the sleeves from the compartments.

7. The modular rack-mounting system as recited in claims 4, 5 or 6 wherein the securing means comprises:
   an outer spring mounted on the frame;
   a button mounted on the outer spring and extending through a hole in the frame into one of the two compartments to engage a corresponding hole in the sleeve when the sleeve is inserted within the one compartment.

* * * * *